(12) United States Patent
Doi et al.

(10) Patent No.: US 7,123,045 B2
(45) Date of Patent: Oct. 17, 2006

(54) SEMICONDUCTOR INTEGRATED CIRCUIT DEVICE

(75) Inventors: Mikiya Doi, Kyoto (JP); Kenichi Nakata, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 75 days.

(21) Appl. No.: 10/936,802

(22) Filed: Sep. 9, 2004

(65) Prior Publication Data

US 2005/0052800 A1    Mar. 10, 2005

(30) Foreign Application Priority Data

Sep. 10, 2003    (JP)    ............................. 2003-317970

(51) Int. Cl.
*H03K 17/16*    (2006.01)
*H03K 19/003*    (2006.01)

(52) U.S. Cl. ............................. 326/23; 326/30; 326/31; 326/32; 326/33; 326/34

(58) Field of Classification Search ................. 326/23, 326/30–34
See application file for complete search history.

(56) References Cited

U.S. PATENT DOCUMENTS

| 4,818,901 A * | 4/1989 | Young et al. .................. 326/27 |
| 4,918,336 A * | 4/1990 | Graham et al. ............. 326/117 |
| 5,426,376 A * | 6/1995 | Wong et al. .................. 326/27 |
| 5,610,537 A * | 3/1997 | Hastings ...................... 326/59 |
| 6,236,248 B1 * | 5/2001 | Koga ......................... 327/112 |

FOREIGN PATENT DOCUMENTS

| JP | 11-046120 | 2/1999 |
| JP | 2001-053558 | 2/2001 |

* cited by examiner

*Primary Examiner*—Rexford Barnie
*Assistant Examiner*—Dylan White
(74) *Attorney, Agent, or Firm*—Arent Fox PLLC

(57) ABSTRACT

When an output voltage output from a buffer approaches a ground voltage, a MOS transistor turns off, so that clamp for a gate of the MOS transistor is released.

8 Claims, 6 Drawing Sheets

SEMICONDUCTOR INTEGRATED CIRCUIT DEVICE

Japanese Patent Application No. 2003-317970 filed on Sep. 10, 2003 is the basic application of the present application.

BACKGROUND OF THE INVENTION

1. Field of the Invention

The present invention relates to a semiconductor integrated circuit device including a clamp circuit for input to an output stage and, more particularly, to a semiconductor integrated circuit device configured as a driver which outputs control signals for performing drive-control of electric/electronic apparatuses.

2. Description of the Prior Art

Conventionally, in a semiconductor integrated circuit device including an operational amplifier and constructed as a driver for performing drive-control of various electric/electronic apparatuses, there is provided an over-current protection circuit for preventing over-currents in an output stage of the operational amplifier. In the prior art, there has been suggested a differential amplifier circuit which includes a clamp circuit as the over-current protection circuit to restrict the current flowing through transistors constituting a buffer section as the output stage (see JP-A 11-46120 (1999)). In this differential amplifier circuit, the upper and lower limits of the output voltage of the amplifier section are restricted by the clamp circuit constituted by diodes.

Also, in the prior art, there has been suggested an operational amplifier which includes a differential amplifier stage, a level shift stage and an output stage and is provided with a voltage clamp circuit in the output stage (see JP-A 2001-53558). This operational amplifier is provided with a clamp circuit constructed by diode-connected MOS transistors in the level shift stage for shifting the levels of the output voltages from the differential amplifier stage and outputting them to the output stage. By providing this clamp circuit in the level shift stage, the amplitudes of the output voltages to the output stage are restricted.

However, when clamp circuits are provided for control electrodes of respective transistors in the output stage formed as a final stage constituted by transistors having opposite polarities, as in the prior art, the voltages to the control electrodes of the respective transistors are restricted; therefore, ON resistance of the transistors are increased. Namely, as illustrated in FIG. 8, the output stage is constituted by a P-channel MOS transistor Tp which is fed with a direct current voltage VDD at its source and an N-channel MOS transistor Tn grounded at its source, and clamp circuits 10a, 10b are connected to the gates of the MOS transistors Tp, Tn.

Here, if there appears a voltage close to the voltage VDD or the ground voltage at the connection node, which is the output, of the drains of the MOS transistors Tp, Tn, the gate voltages of the MOS transistors Tp, Tn are restricted by the clamp circuits 10a, 10b. Accordingly, the ON resistance of the MOS transistors Tp, Tn is increased, which narrows the dynamic range of the voltage output from the connection node of the drains of the MOS transistors Tp, Tn.

SUMMARY OF THE INVENTION

In view of the above problems, it is an object of the present invention to provide a semiconductor integrated circuit device including an over-current protection circuit capable of reducing influence of ON resistance of transistors in an output stage.

In order to achieve the above object, a semiconductor integrated circuit device according to the present invention includes an output stage constituted by transistors and a clamp circuit including a switch which turns off when the output voltage from the output stage is in a predetermined voltage range and restricting input voltages to control electrodes of the transistors in the output stage, wherein when the switch is in the ON state, the clamp circuit restricts the input voltages to the control electrodes of the transistors, while when the switch is in the OFF state, the input voltages to the control electrodes of the transistors are input to the control electrodes of the transistors without being restricted even though the input voltages are in the range which is restricted by the clamp circuit.

In the semiconductor integrated circuit device, when the output voltage from the output stage is out of a predetermined voltage range, the switch is in the ON state. Therefore, when the input voltages to the control electrodes of the transistors reach predetermined values, the clamp circuit restricts the input voltages to the control electrodes of the transistors. Also, the output voltage from the output stage is in the predetermined voltage range, the switch is in the OFF state and, thus, the input voltages to the control electrodes of the transistors are input to the control electrodes of the transistors without being restricted by the clamp circuit.

DESCRIPTION OF THE PREFERRED EMBODIMENTS

First Embodiment

Figure 1:
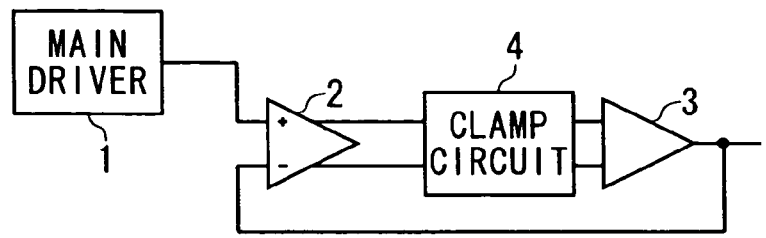
FIG. 1 is a block diagram illustrating an internal structure of a semiconductor integrated circuit device constituting a driver according to the present invention.
Figure 2:
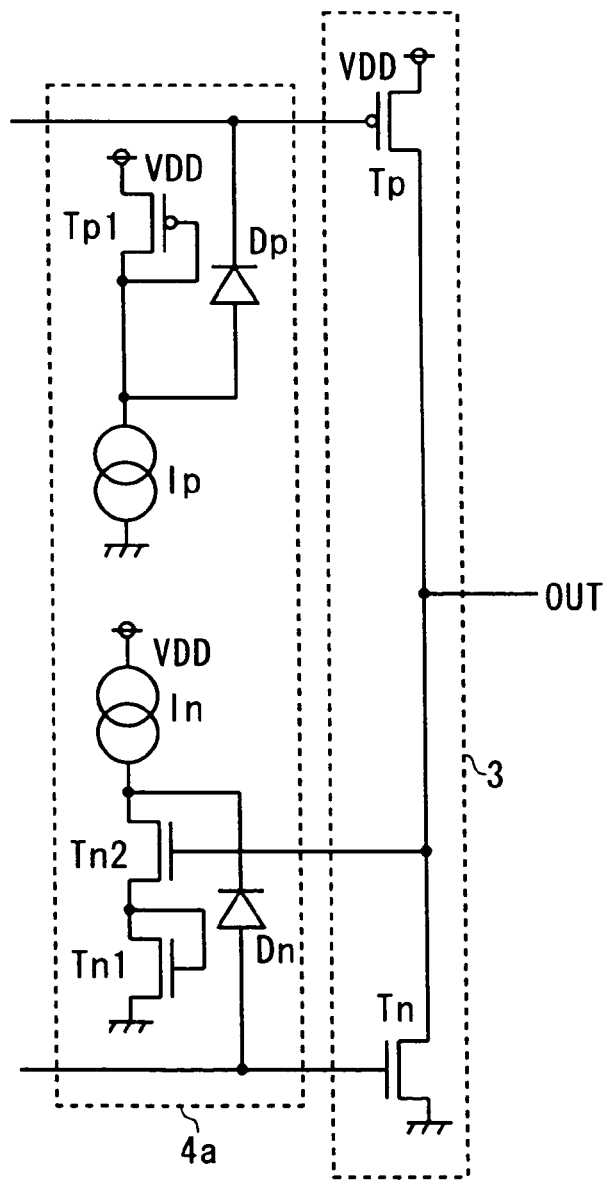
FIG. 2 is a circuit diagram illustrating structures of a clamp circuit and a buffer in a driver according to a first embodiment.

Hereinafter, a first embodiment of the present invention will be explained with reference to the drawings. FIG. 1 is a block diagram illustrating a block structure of a driver which is common to this embodiment and other embodiments. FIG. 2 is a circuit diagram illustrating structures of a buffer and a clamp circuit in the driver according to this embodiment. The driver according to this embodiment is constructed in a single semiconductor circuit device.

The driver illustrated in FIG. 1 includes a main driver 1 which converts digital signals, which are input from the outside as values for controlling electric/electronic apparatuses, into analog signals indicated as voltage values and outputs the analog signals, an amplifier 2 to which output voltages from the main driver 1 are input with the positive phase, a buffer 3 to which the amplified voltages from the amplifier 2 are input, and a clamp circuit 4 which operates for over-current protection to restrict the current flowing through the buffer 3.

In the driver of FIG. 1, outputs from the buffer 3 are output as control signals for controlling the electric/electronic apparatuses and, also, are input to the amplifier 2 with the negative phase, wherein the amplifier 2 and the buffer 3 operate as a negative feed back circuit. The clamp circuit 4 restricts the value of the voltage output from the amplifier 2 and then input to the buffer 3 to carry out the over-current protection for the buffer 3 and, also, detects the voltage value of the output from the buffer 3 to turn on and off. Further, the amplifier 2 generates two outputs, which are input to the gates of two MOS transistors Tp and Tn constituting the buffer 3, which will be described later.

In the driver structured as described above, the main driver 1 outputs voltage values corresponding to the values of digital signals input from the outside. The voltage values from the main driver 1 are amplified by the amplifier 2 and the buffer 3 and, then, are output to the outside as control signals, which drive the external electric/electronic apparatuses. At this time, the output voltages from the amplifier 2 are input to the buffer 3 through the clamp circuit 4. Hereinafter, the detail structures and operations of the buffer 3 and the clamp 4 in the driver having this structure will be explained based on FIG. 2.

The buffer 3 includes a P-channel MOS transistor Tp which is supplied with one output of the amplifier 2 at its gate and fed with a power supply voltage VDD at its source, and an N-channel MOS transistor Tn which is supplied with the other output of the amplifier 2 at its gate and is grounded at its source. A connection node of the drains of the MOS transistors Tp, Tn forms the output.

A clamp circuit 4a (corresponding to the clamp circuit 4 of FIG. 1) includes a P-channel MOS transistor Tp1 which is fed with the power supply voltage VDD at its source with its drain and gate connected to each other, a diode Dp connected at its cathode to the gate of the MOS transistor Tp, a constant current source Ip which is connected at its one end to the connection node of the drain of the MOS transistor Tp1 and the anode of the diode Dp and is grounded at the other end, an N-channel MOS transistor Tn1 which is grounded at its source with its drain and gate connected to each other, an N-channel MOS transistor Tn2 which is connected at its source to the drain of the MOS transistor Tn1 and is connected at its gate to the connection node of the drains of the MOS transistors Tp, Tn, a diode Dn connected at its anode to the gate of the MOS transistor Tn, and a constant current source In which is connected at its one end to the connection node of the drain of the MOS transistor Tn2 and the cathode of the diode Dn and is fed with the power supply voltage VDD at the other end.

In the buffer 3 and the clamp circuit 4a structured as described above, the voltage determined by the ON resistance of the MOS transistor Tp1, the threshold voltage of the diode Dp and the current value of the constant current source Ip sets the lower limit of the value of the voltage which is applied to the gate of the MOS transistor Tp in the buffer 3. Thus, the value of the current flowing through the MOS transistor Tp is restricted by the MOS transistor Tp1, the diode Dp and the constant current source Ip. Also, the voltage determined by the ON resistance of the MOS transistor Tn1, the threshold voltage of the diode Dn and the current value of the constant current source In sets the upper limit of the value of the voltage which is applied to the gate of the MOS transistor Tn in the buffer 3. Thus, the value of the current flowing through the MOS transistor Tn is restricted by the MOS transistor Tn1, the diode Dn and the constant current source In.

Furthermore, there is provided a MOS transistor Tn2 which turns on and off depending on the value of the output voltage from the buffer 3 in the clamp circuit including the MOS transistor Tn1, the diode Dn and the constant current source In for restricting the current flowing through the MOS transistor Tn. Accordingly, if the output voltage value of the buffer 3 drops below a predetermined value, the MOS transistor Tn2 turns off, thus preventing the clamp circuit including the MOS transistor Tn1, the diode Dn and the constant current source In from operating. Consequently, the value of the output voltage which is applied from the amplifier 2 to the gate of the MOS transistor Tn in the buffer 3 is not restricted by the clamp circuit 4a. Therefore, the gate of the MOS transistor Tn may be fed with voltages higher than the voltage value to which the clamp circuit 4 restricts voltage, thereby reducing the ON resistance of the MOS transistor Tn.

Namely, the relation between the voltage Vin applied by the main driver 1 and the gate voltages Vgn, Vgp of the MOS transistors Tn, Tp, and the relation between the voltage Vin applied by the main driver 1 and the output voltage Vout of the buffer 3 are expressed as in FIG. 3, wherein the voltages generated at the drains of the MOS transistors Tp1, Tn2 are defined as Vp, Vn, the threshold voltage of the diodes Dp, Dn is defined as Vd, and the output voltage value of the buffer 3 which switches between the ON and OFF states of the MOS transistor Tn2 is defined as Vtha.

Figure 3A:
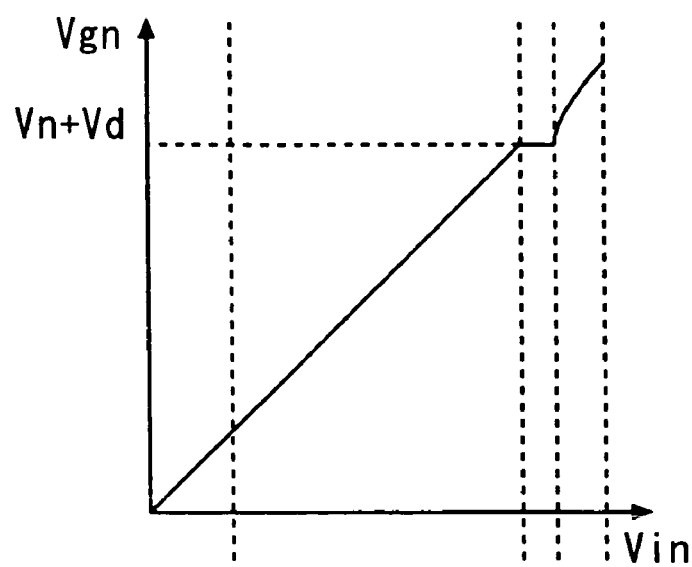
FIG. 3 is an illustration for explaining operations of the clamp circuit and the buffer in FIG. 2.
Figure 3B:
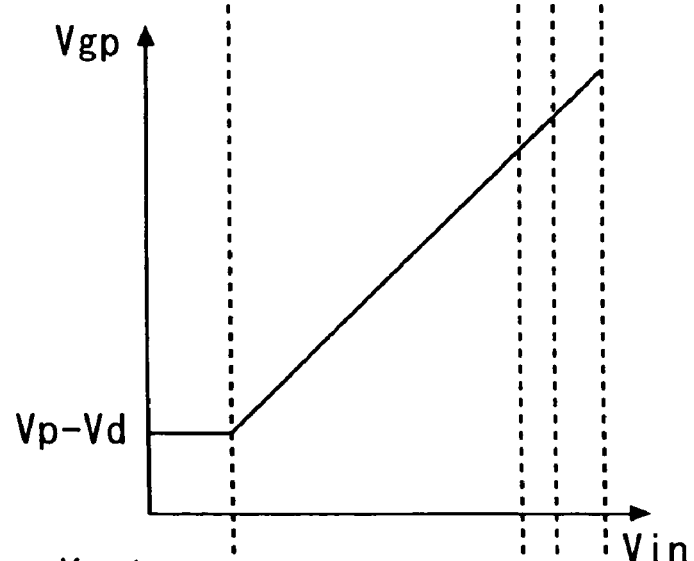

Namely, when the voltage Vin from the main driver 1 is gradually increased from 0, once the voltage output from the amplifier 2 to the gate of the MOS transistor Tp exceeds the voltage Vp−Vd caused by the MOS transistor Tp1 and the diode Dp in the clamp circuit 4a, the diode Dp turns off, thus releasing the clamp for the gate of the MOS transistor Tp. Accordingly, as illustrated in FIG. 3B, the gate voltage Vgp of the MOS transistor Tp increases from the voltage value Vp−Vd, while it was constant at the voltage value Vp−Vd until then. At this time, as illustrated in FIG. 3A, the gate voltage Vgn of the MOS transistor Tn is lower than the voltage Vn+Vd caused by the MOS transistors Tn1, Tn2 and the diode Dn in the clamp circuit 4a; therefore, the gate voltage Vgn of the MOS transistor Tn is not clamped and increases with increasing voltage Vin of the main driver 1.

Figure 3C:
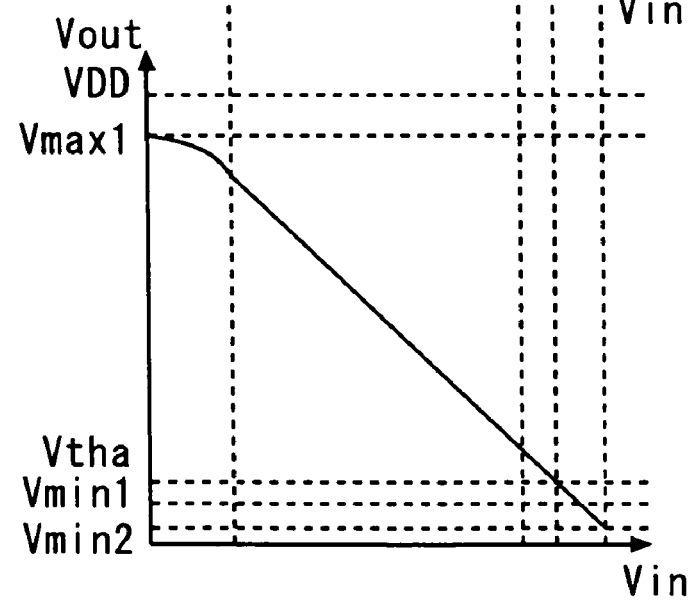

Consequently, as illustrated in FIG. 3C, the output voltage Vout of the buffer 3 which appears at the connection node of the drains of the MOS transistors Tp, Tn decreases gradually from a maximum value of Vmax1 with increasing voltage Vin from the main driver 1. At this time, the output voltage Vout form the buffer 3 is higher than the voltage value Vtha; therefore, the MOS transistor Tn2 is in the ON state.

Then, when the voltage Vin from the main driver 1 is further increased, the voltage output from the amplifier 2 to the gate of the MOS transistor Tn exceeds the voltage Vn+Vd caused by the MOS transistors Tn1, Tn2 and the diode Dn. Since the output voltage of the buffer 3 is higher than the voltage value Vtha and the MOS transistor Tn2 is in the ON state, the diode Dn turns on, thus engaging the clamp to the gate of the MOS transistor Tn. Consequently, as illustrated in FIG. 3A, the gate voltage Vgn of the MOS transistor Tn is maintained at the constant voltage value Vn+Vd. At this time, as illustrated in FIG. 3B, the gate voltage Vgp of the MOS transistor Tp increases with increasing voltage Vin from the main driver 1.

The output voltage Vout of the buffer 3 which appears at the connection node of the drains of the MOS transistors Tp, Tn gradually decreases with increasing the voltage Vin from the main driver 1, as illustrated in FIG. 3C. Then, when the voltage Vin from the main driver 1 is further increased and the output voltage Vout of the buffer 3 decreases below the voltage value Vtha, the MOS transistor Tn2 turns off. Consequently, no current flows through the MOS transistor Tn1, which releases the clamp for the gate of the MOS transistor Tn. Thus, as illustrated in FIG. 3A, the gate voltage Vgn of the MOS transistor Tn increases with increasing voltage Vin from the main driver 1. At this time, as illustrated in FIG. 3B, the gate voltage Vgp of the MOS transistor Tp increases with increasing the voltage Vin from the main driver 1.

Consequently, the output voltage Vout of the buffer 3 which appears at the connection node of the drains of the MOS transistors Tp, Tn further decreases with increasing the voltage Vin from the main driver 1 as illustrated in FIG. 3C. At this time, since the clamp for the gate of the MOS transistor Tn is released and this allows the gate voltage of the MOS transistor Tn to further increase, the ON resistance of the MOS transistor Tn may be made lower than in the clamp-engaged state. Therefore, the output voltage Vout of the buffer 3 has a minimum value Vmin 2, which is lower than the minimum value Vmin1 of the output voltage Vout of a conventional buffer 3.

Furthermore, in the operating state where the MOS transistor Tn2 is in the OFF state and, thus, the clamp for the gate of the MOS transistor Tn is released, if a current greater than a predetermined amount flows through the MOS transistor Tn, the output voltage Vout of the buffer 3 becomes higher than the voltage value Vtha because of the ON resistance of the MOS transistor Tn. This causes the MOS transistor Tn2 to turn on, thereby engaging the clamp to the MOS transistor Tn again. Consequently, the gate voltage Vgn of the MOS transistor Tn may be restricted; therefore, the current flowing through the MOS transistor Tn may be restricted.

Second Embodiment

Figure 4:
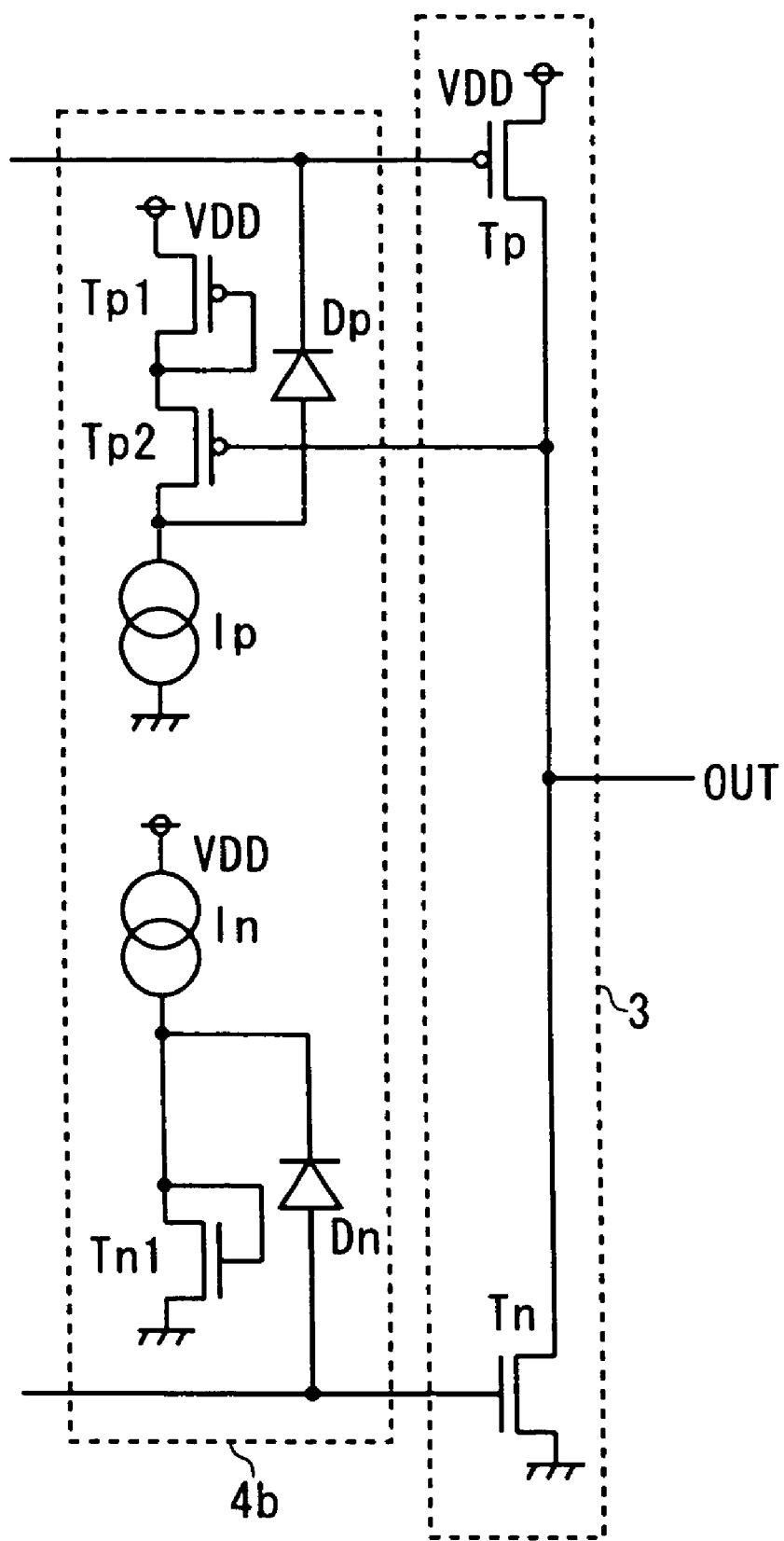
FIG. 4 is a circuit diagram illustrating structures of a clamp circuit and a buffer in a driver according to a second embodiment.

A second embodiment of the present invention will be explained with reference to drawings. FIG. 4 is a circuit diagram illustrating structures of a buffer and a clamp circuit in a driver according to this embodiment. The driver according to this embodiment has the block structure as illustrated in FIG. 1 and is constructed in a single semiconductor integrated circuit device, similarly to the first embodiment. In the structure of FIG. 4, the same elements as those illustrated in FIG. 2 are designated by the same reference symbols and will not be described herein in detail.

As illustrated in FIG. 4, the buffer 3 in the driver according to this embodiment is constituted by a MOS transistor Tp and an N-channel MOS transistor Tn, similarly to the first embodiment. Further, unlike the clamp circuit 4a according to the first embodiment, a clamp circuit 4b (corresponding to the clamp circuit 4 of FIG. 1) is structured to further include a P-channel MOS transistor Tp2 which is connected at its source to the drain of the MOS transistor Tp1 and is connected at its drain to the anode of the diode Dp. Further, in the clamp circuit 4a, the MOS transistor Tn2 is eliminated and the cathode of the diode Dn is connected to the drain of the MOS transistor Tn1. Further, the connection node of the drains of the MOS transistors Tp, Tn is connected to the gate of the MOS transistor Tp2. Thus, the MOS transistor Tp2 turns on and off depending on the output voltage from the buffer 3.

In the clamp circuit 4b having this structure, unlike in the first embodiment, the relation between the voltage Vin supplied from the main driver 1 and the gate voltages Vgn, Vgp of the MOS transistors Tn, Tp, and the relation between the voltage Vin from the main driver 1 and the output voltage Vout of the buffer 3 are expressed as in FIG. 5, wherein the voltages generated at the drains of the MOS transistors Tp2, Tn1 are defined as Vp, Vn, the threshold voltage of the diodes Dp and Dn is defined as Vd, and the output voltage value of the buffer 3 which switches between the ON and OFF states of the MOS transistor Tp2 is defined as Vthb.

Figure 5A:
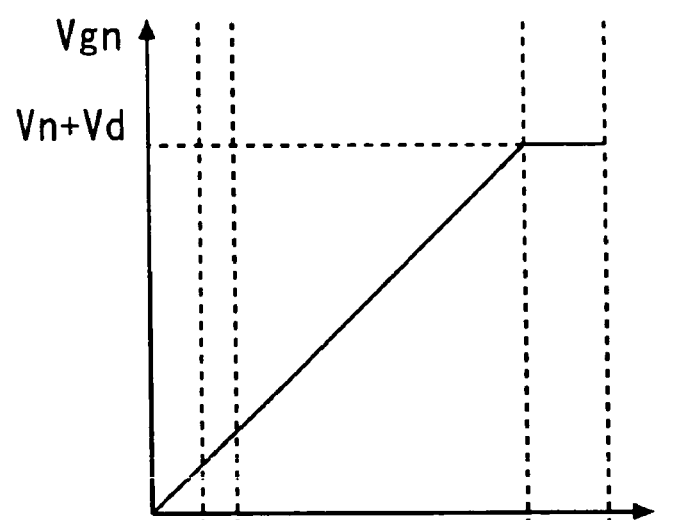
FIG. 5 is an illustration for explaining operations of the clamp circuit and the buffer in FIG. 4.
Figure 5B:
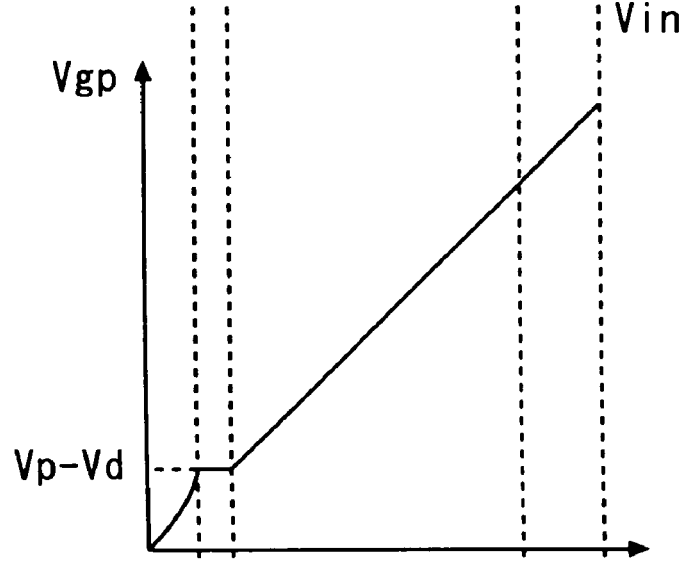
Figure 5C:
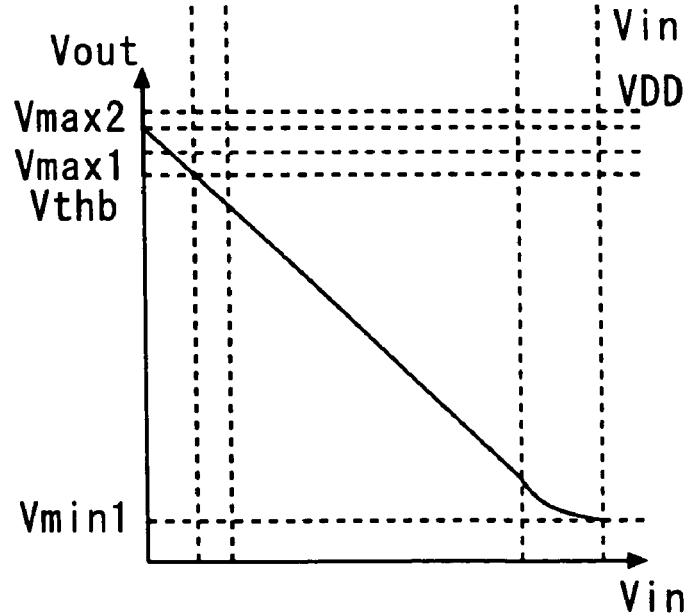

Namely, when the voltage Vin from the main driver 1 is gradually decreased from a maximum value, once the voltage output from the amplifier 2 to the gate of the MOS transistor Tn drops below the voltage Vn+Vd caused by the MOS transistor Tn1 and the diode Dn, the diode Dn turns off. Consequently, as illustrated in FIG. 5A, the gate voltage Vgn of the MOS transistor Tn decreases from the voltage value Vn+Vd, while it was maintained at the constant voltage value Vn+Vd until then. At this time, as illustrated in FIG. 5B, the gate voltage Vgp of the MOS transistor Tp is higher than the voltage Vp−Vd caused by the MOS transistors Tp1, Tp2 and the diode Dp; therefore, the gate voltage Vgp of the MOS transistor Tp is not clamped and decreases with decreasing the voltage Vin from the main driver 1. Consequently, as shown in FIG. 5C, the output voltage Vout of the buffer 3 gradually increases from a minimum value of Vmin1 with decreasing the voltage Vin from the main driver 1. At this time, the output voltage Vout from the buffer 3 is lower than the voltage value Vthb; therefore, the MOS transistor Tn2 is in the ON state.

Then, when the voltage Vin from the main driver 1 is further decreased, the voltage which is output from the amplifier 2 to the gate of the MOS transistor Tp decreases below the voltage Vp−Vd. Therefore, since the output voltage of the buffer 3 is lower than the voltage value Vthb and, thus, the MOS transistor Tp2 is in the ON state, the diode Dp turns ON, thereby engaging the clamp to the gate of the MOS transistor Tp. Consequently, as illustrated in FIG. 5B, the gate voltage Vgp of the MOS transistor Tp is maintained at the constant voltage value Vp−Vd. At this time, as illustrated in FIG. 5A, the gate voltage Vgn of the MOS transistor Tn decreases with decreasing the voltage Vin from the main driver 1. Thus, the output voltage Vout of the buffer 3 gradually increases with decreasing the voltage Vin from the main driver 1, as illustrated in FIG. 5C.

Then, when the voltage Vin from the main driver 1 is further decreased and the output voltage Vout of the buffer 3 exceeds the voltage value Vthb, the MOS transistor Tp2 turns off. Consequently, no current flows through the MOS transistor Tp1, which releases the clamp for the gate of the MOS transistor Tp. Consequently, the gate voltage Vgp of the MOS transistor Tp decreases with decreasing the voltage Vin from the main driver 1, as illustrated in FIG. 5B. At this time, the gate voltage Vgn of the MOS transistor Tn decreases with decreasing the voltage Vin from the main driver 1, as illustrated in FIG. 5A. Accordingly, the output voltage Vout of the buffer 3 further increases with decreasing the voltage Vin from the main driver 1.

At this time, since the clamp for the gate of the MOS transistor Tp is released and this allows the gate voltage of the MOS transistor Tp to be further decreased, the ON resistance of the MOS transistor Tp may be made lower than in the clamp-engaged state. Therefore, the output voltage Vout of the buffer 3 has a maximum value Vmax2, which is higher than the maximum value Vmax1 of the output voltage Vout of the buffer 3 according to the first embodiment.

Furthermore, in the operating stage where the MOS transistor Tp2 is in the OFF state and, thus, the clamp for the gate of the MOS transistor Tp is released, if a current greater than a predetermined amount flows through the MOS transistor Tp, the output voltage Vout of the buffer 3 drops below the voltage value Vthb because of the ON resistance of the MOS transistor Tp. This causes the MOS transistor Tp2 to turn ON, thereby engaging the clamp to the MOS transistor Tp again. Consequently, the gate voltage Vgp of the MOS transistor Tp may be restricted; therefore, the current flowing through the MOS transistor Tp may be restricted.

Third Embodiment

Figure 6:
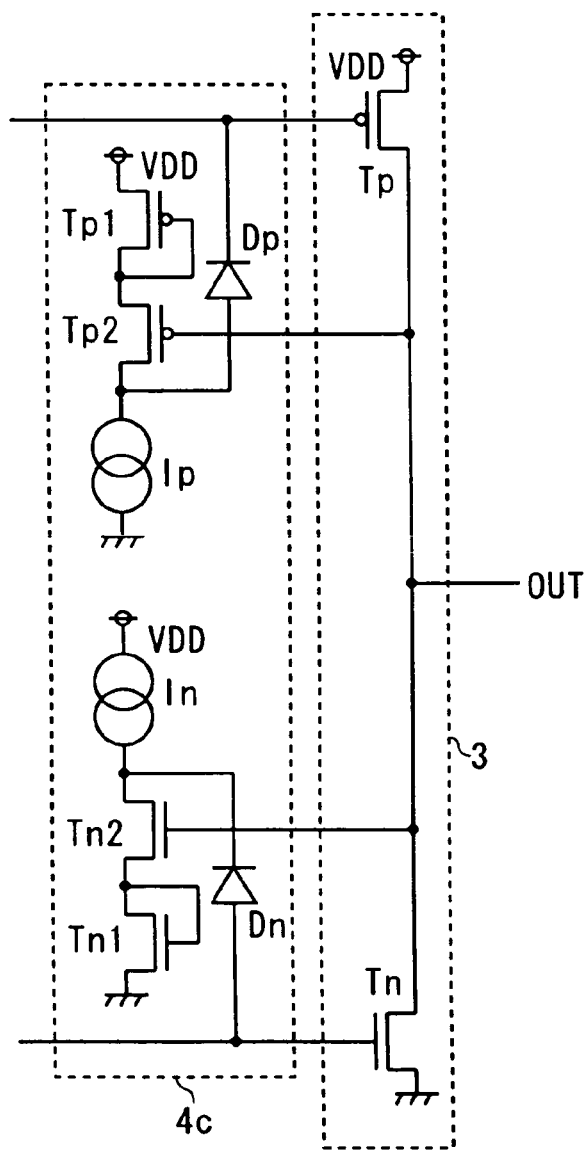
FIG. 6 is a circuit diagram illustrating structures of a clamp circuit and a buffer in a driver according to a third embodiment.

Hereinafter, a third embodiment of the present invention will be explained with reference to drawings. FIG. 6 is a circuit diagram illustrating structures of a buffer and a clamp circuit in a driver according to this embodiment. The driver according to this embodiment has the block structure as illustrated in FIG. 1 and is provided in a single semiconductor integrated circuit device, similarly to the first embodiment. In the structure of FIG. 6, the same elements as those illustrated in FIGS. 2 and 4 are designated by the same reference symbols and will not be described herein in detail.

A clamp circuit 4c (corresponding to the clamp circuit 4 of FIG. 1) in the driver according to this embodiment is constituted by the MOS transistors Tn1, Tn2, the diode Dn and the constant current source In in the clamp circuit 4a according to the first embodiment, and the MOS transistors Tp1, Tp2, the diode Dp and the constant current source Ip in the clamp circuit 4b according to the second embodiment. Thus, the MOS transistors Tn1, Tn2, the diode Dn and the constant current source In provided for the MOS transistor Tn in the buffer 3 carry out the operations previously described in the first embodiment, while the MOS transistors Tp1, Tp2, the diode Dp and the constant current source Ip provided for the MOS transistor Tp in the buffer 3 carry out the operations previously described in the second embodiment.

By such a structure, when the gate voltage of the MOS transistor Tn is higher than the voltage value Vn+Vd and the output voltage Vout from the buffer 3 is higher than the voltage value Vtha, the diode Dn and the MOS transistor Tn2 are in the ON state, thus engaging the clamp to the MOS transistor Tn. Also, when the gate voltage of the MOS transistor Tp is lower than the voltage value Vp−Vd and the output voltage Vout from the buffer 3 is lower than the voltage value Vthb, the diode Dp and the MOS transistor Tp2 are in the ON state, thus engaging the clamp to the MOS transistor Tp.

Figure 7:
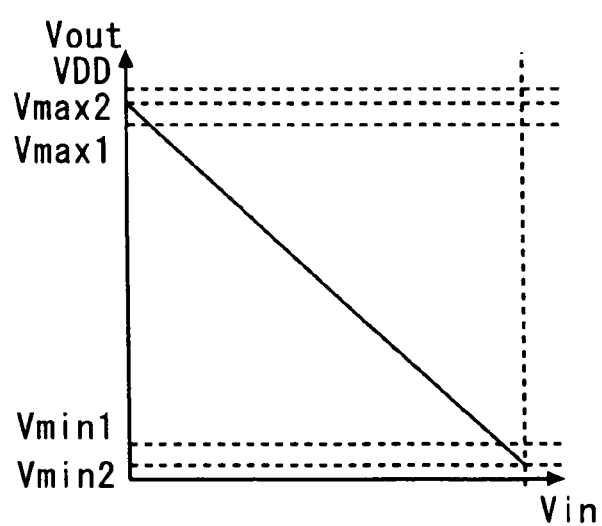
FIG. 7 is an illustration showing the relation between input and output of the driver according to the third embodiment.
Figure 8:
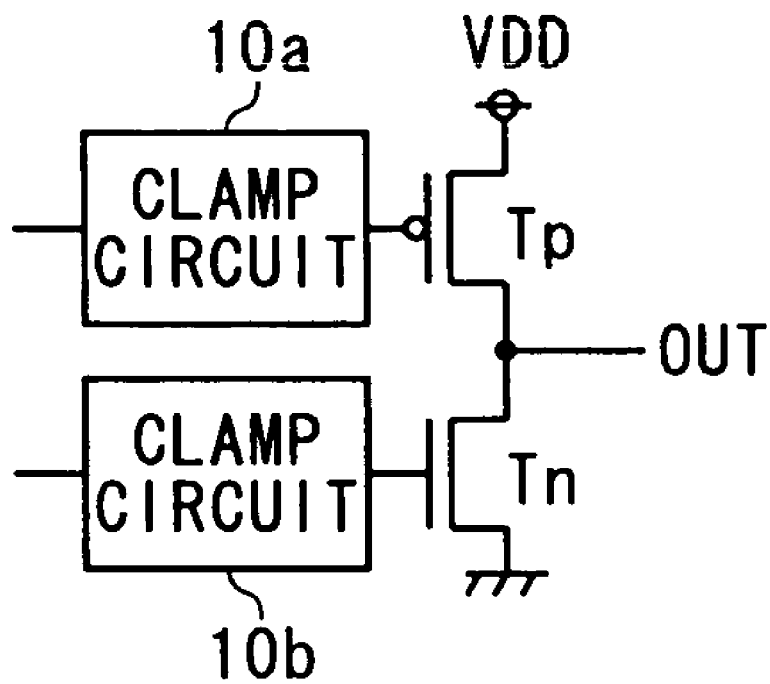
FIG. 8 is a block circuit diagram illustrating structures of a clamp circuit and a buffer in a conventional semiconductor integrated circuit device.

Accordingly, when the output voltage Vout from the buffer circuit 3 is lower than the voltage value Vtha, the ON resistance of the MOS transistor Tn may be reduced, while when the output voltage Vout from the buffer 3 is higher than the voltage value Vthb, the ON resistance of the MOS transistor Tp may be reduced. Consequently, the output voltage Vout from the buffer circuit 3 may have a dynamic range from Vmin2 to Vmax2, as illustrated in FIG. 7.

A clock input/output device according to the present invention is applicable to a semiconductor integrated circuit device constituting a driver for performing drive-control of various types of electric/electronic apparatuses.

Further, according to the present invention, when the output voltage from the output stage is within a predetermined voltage range, the clamp circuit is in the OFF state; therefore, the input voltages to the control electrodes of the transistors in the output stage are input to the control electrodes of these transistors without being restricted even though the input voltages are within the range which is restricted by the clamp circuit. Accordingly, as compared with the case where the input voltages to the transistors are restricted by the clamp circuit, the ON resistance of the transistors may be reduced, thereby reducing the influence thereof on the output voltage of the output stage. Further, when the value of current flowing through the transistors in the output stage exceeds a predetermined value, the voltage caused by the ON resistance of the transistors is increased; therefore, the output voltage from the output stage is out of the predetermined voltage range, causing the clamp circuit to turn on. As described above, it becomes possible to constitute an over-current protection circuit which restricts the value of the current flowing through the transistors in the output stage with a clamp circuit and, also, to widen the dynamic range of the output from the output stage.

What is claimed is:

1. A semiconductor integrated circuit device comprising:
an output stage including a first transistor which is fed with a first direct current voltage at its first electrode, a control electrode of the first transistor being used as an input of the output stage and a second electrode of the first transistor being used as an output of the output stage; and
a clamp circuit restricting an input voltage to the control electrode of the first transistor in the output stage,
wherein
the clamp circuit includes:
a second transistor which is fed with the first direct current voltage at its first electrode, in which a second electrode and a control electrode are connected each other;
a switch connected at its one end to the second electrode of the second transistor;
a constant current source which is connected at its one end to the other end of the switch and is fed with a second direct current voltage different from the first direct current voltage at the other end; and
a diode which is connected between the control electrode of the first transistor and the other end of the switch,
wherein
the switch turns off when the output voltage from the second electrode of the first transistor approaches closely the first direct current voltage than a predetermined voltage, and
wherein
when the switch is in the ON state, the clamp circuit restricts the input voltage to the control electrode of the first transistor, and
when the switch is in the OFF state, the input voltage to the control electrode of the first transistor is input to the control electrode of the first transistor without being restricted even though the input voltage is within the range which is restricted by the clamp circuit.

2. A semiconductor integrated circuit device according to claim 1, wherein the first and second transistors are N-channel MOS transistors.

3. A semiconductor integrated circuit device according to claim 1, wherein the first and second transistors are P-channel MOS transistors.

4. A semiconductor integrated circuit device according to claim 1, wherein the output stage includes: a third transistor having a polarity opposite to that of the first transistor, the third transistor being fed with the second direct current voltage at its first electrode, a control electrode of the third transistor being used as an input of the output stage, a second electrode of the third transistor being connected to the second electrode of the first transistor and used an output of the output stage.

5. A semiconductor integrated circuit device according to claim 1, wherein the switch is a transistor.

6. A semiconductor integrated circuit device comprising:
an output stage constricted by transistors; and
a clamp circuit including a switch, which is in the OFF state when an output voltage from the output stage is within a predetermined voltage range, and restricting input voltages to control electrodes of the transistors in the output stage,
wherein
the output stage includes:
a first transistor which is fed with a first direct current voltage at its first electrode, a control electrode of the first transistor being used as an input of the output stage and a second electrode of the first transistor being used as an output of the output stage; and
a second transistor having a polarity opposite to that of the first transistor, the second transistor being fed with a second direct current voltage different from the first direct current voltage at its first electrode, a control electrode of the second transistor being used as an input of the output stage and a second electrode of the second transistor being connected to the second electrode of the first transistor and used as an output of the output stage,
wherein
the clamp circuit includes:
a third transistor which is fed with the first direct current voltage at its first electrode, in which a second electrode and a control electrode are connected to each other;
a first switch connected at its one end to the second electrode of the third transistor;
a first constant current source which is connected at its one end to the other end of the first switch and is fed with the second direct current voltage at the other end;
a first diode connected between the control electrode of the first transistor and the other end of the first switch;
a forth transistor which is fed with the second direct current voltage at its first electrode, in which a second electrode and a control electrode are connected to each other;

a second switch connected at its one end to the second electrode of the forth transistor;
a second constant current source which is connected at its one end to the other end of the second switch and is fed with the first direct current voltage at the other end;
a second diode connected between the control electrode of the second transistor and the other end of the second switch,
wherein
when the first switch is in the ON state, the clamp circuit restricts the input voltage to the contrl electrode of the first transistor, and
when the first switch is in the OFF state, the input voltage to the control electrode of the first transistor is input to the control electrode of the first transistor without being restricted even though the input voltage is within the range which is restricted by the clamp circuit,
wherein
when the second switch is in the ON state, the clamp circuit restricts the input voltage to the control electrode of the second transistor, and
when the second switch is in the OFF state, the input voltage to the control electrode of the second transistor is input to the control electrode of the second transistor without being restricted even though the input voltage is within the range which is restricted by the clamp circuit, and
wherein
the first switch turns off when the output voltage from the second electrode of the first transistor approaches closely the first direct current voltage than a first predetermined voltage, and the second switch turns off when the output voltage from the second electrode of the second transistor approaches closely the second direct current voltage than a second predetermined voltage.

7. A semiconductor integrated circuit device according to claim 6, wherein the first and third transistors are N-channel MOS transistors, and the second and forth transistors are P-channel MOS transistors.

8. A semiconductor integrated circuit device according to claim 6, wherein the switch is a transistor.

* * * * *